(12) United States Patent
Takemoto et al.

(10) Patent No.: US 7,427,851 B2
(45) Date of Patent: Sep. 23, 2008

(54) CAPACITOR UNIT

(75) Inventors: Junji Takemoto, Nishinomiya (JP); Shusaku Kawasaki, Osaka (JP); Tatehiko Inoue, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 172 days.

(21) Appl. No.: 10/543,013

(22) PCT Filed: Sep. 15, 2004

(86) PCT No.: PCT/JP2004/013874

§ 371 (c)(1),
(2), (4) Date: Jul. 22, 2005

(87) PCT Pub. No.: WO2005/029674

PCT Pub. Date: Mar. 31, 2005

(65) Prior Publication Data

US 2006/0061937 A1 Mar. 23, 2006

(30) Foreign Application Priority Data

Sep. 18, 2003 (JP) ............................. 2003-325814
Sep. 18, 2003 (JP) ............................. 2003-325816

(51) Int. Cl.
*H02J 7/00* (2006.01)
(52) U.S. Cl. ..................................... 320/166; 320/150
(58) Field of Classification Search ................ 361/434, 361/541, 328, 329, 306.1, 701–703, 709, 361/719–720, 730, 741, 769, 816, 238, 128; 320/166, 150, 167; 363/16
See application file for complete search history.

(56) References Cited

U.S. PATENT DOCUMENTS

| | | | | |
|---|---|---|---|---|
| 2,834,922 A | * | 5/1958 | Selgin | 361/769 |
| 4,292,665 A | * | 9/1981 | Hersom et al. | 363/141 |
| 4,325,103 A | * | 4/1982 | Ito et al. | 361/816 |
| 5,434,747 A | * | 7/1995 | Shibata | 361/753 |
| 5,752,084 A | * | 5/1998 | Motomura et al. | 396/6 |
| 5,796,579 A | * | 8/1998 | Nakajima et al. | 361/683 |
| 6,066,002 A | * | 5/2000 | Sterckx et al. | 439/607 |

(Continued)

FOREIGN PATENT DOCUMENTS

JP 59-53041 A 3/1984

(Continued)

OTHER PUBLICATIONS

English translation of International Search Report for PCT/JP2004/013874, dated Jan. 18, 2005.

Primary Examiner—Adolf Berhane
Assistant Examiner—M'Baye Diao
(74) Attorney, Agent, or Firm—RatnerPrestia

(57) ABSTRACT

A capacitor unit using a plurality of capacitors and which has a long lifetime and is maintenance-free is provided. The capacitor unit has a high reliability even in harsh using conditions of vibration and shock and a high noise resistant property. This capacitor unit includes a capacitor block in which a plurality of capacitors are incorporated into a holder with body portions of the capacitors sandwiched; a control circuit portion including a charging and discharging circuit for charging or discharging this capacitor block; a relay connector for electrically connecting thereof, and a case housing thereof.

19 Claims, 11 Drawing Sheets

U.S. PATENT DOCUMENTS

| | | | |
|---|---|---|---|
| 6,075,378 A * | 6/2000 | Okamura | 324/771 |
| 6,147,869 A * | 11/2000 | Furnival | 361/719 |
| 6,212,074 B1 * | 4/2001 | Gonsalves et al. | 361/717 |
| 6,238,221 B1 * | 5/2001 | Ikeda et al. | 439/76.2 |
| 6,265,840 B1 * | 7/2001 | Wiezorek et al. | 318/434 |
| 6,556,456 B1 * | 4/2003 | Takehara | 361/818 |
| 7,115,825 B2 * | 10/2006 | Aisenbrey | 200/262 |

FOREIGN PATENT DOCUMENTS

| | | |
|---|---|---|
| JP | 63-97286 | 6/1988 |
| JP | 08-130387 A | 5/1996 |
| JP | 10-189402 | 7/1998 |
| JP | 11-312884 A | 11/1999 |
| JP | 2000-184752 A | 6/2000 |
| JP | 2002-124791 A | 4/2002 |
| JP | 2002-217343 A | 8/2002 |
| WO | WO 00/17994 A1 | 3/2000 |

* cited by examiner

CAPACITOR UNIT

THIS APPLICATION IS A U.S. NATIONAL PHASE APPLICATION OF PCT INTERNATIONAL APPLICATION PCT/JP2004/013874.

TECHNICAL FIELD

The present invention relates to an emergency power supply of electronic equipment using a battery, etc. In particular, it relates to a capacitor unit used for an electric braking system, etc. for electrically braking a vehicle.

BACKGROUND ART

Recently, from the viewpoint of conservation of global environment or improvement in fuel consumption, hybrid cars or electric vehicles have been rapidly developed.

Furthermore, various functions for controlling vehicles have been rapidly electronized. Braking of vehicles is also being shifted from a conventional mechanical hydraulic control to electric hydraulic control, and various electric braking systems are proposed.

When an important function such as braking is out of order because voltage reduces in a battery used as a power supply or certain contingencies occur and power is not supplied, hydraulic control cannot be carried out. Therefore, a redundant system using an emergency power supply is often provided.

Conventionally, a method using another battery as an emergency power supply has been proposed. However, a battery has a characteristic of deteriorating over time and its expected lifetime is at most five years when it is used for a vehicle.

Furthermore, it is difficult to detect deterioration in the process and to exhibit a function as an emergency power supply when certain contingencies occur.

Recently, as an emergency power supply substituting for a battery, much attention has been focused on a capacitor such as an electric double layer capacitor. When a capacitor is used in a way in which, for example, charging is carried out when a system is operating and discharging is carried out when a system is not operating, the lifetime of the capacitor can be extended to several times as the lifetime of a battery. Therefore, it is said that a capacitor can withstand the use for 15 years, that is, a target lifetime of a vehicle.

Furthermore, by monitoring characteristic value of a capacitor such as electrostatic capacity and internal resistance, it is possible to understand the change in the characteristics.

Note here that prior art document information as to such a capacitor unit includes, for example, Japanese Patent Unexamined Publication No. 10-189402.

Furthermore, conventionally, a capacitor, other circuit components and a circuit board have been mounted as follows. FIG. 14 is an example of a sectional view showing a conventional mounting. In FIG. 14, on circuit board 501, circuit components 502 constituting a necessary circuit portion are mounted. In general, circuit board 501 is used with the end portion thereof fixed to attaching portion 505 of case 504 by using screw 503, etc.

Information on such a conventional technology is disclosed in, for example, Japanese Utility Model Unexamined Publication No. S63-97286.

SUMMARY OF THE INVENTION

A capacitor unit includes: a capacitor block formed by incorporating a plurality of capacitors into a holder with body portions of the capacitors sandwiched and electrically connecting the capacitors in series or in parallel; a control circuit portion including a charging and discharging circuit for charging or discharging the capacitor block; a relay connector for electrically connecting the capacitor block and the control circuit portion; and a case housing the capacitor block, the control circuit portion and the relay connector. The control circuit portion includes a circuit board, a circuit component forming the charging and discharging circuit, a heat radiator for suppressing heat generation of the circuit component in charging and discharging, a microcomputer for detecting and controlling states of the charging and discharging circuit and the capacitor block, and a connector connected to an external load. The control circuit portion is incorporated into the case in a way in which the circuit board is housed in the case in an upright position with respect to the case.

DETAIL DESCRIPTION OF THE PREFERRED EMBODIMENTS

A capacitor has a shortcoming that the withstand voltage is low due to its nature. Therefore, in order to obtain a necessary voltage, it is necessary to use a plurality of capacitors connected in series. Furthermore, depending upon a necessary energy amount, the series-connected capacitors is required to be used in parallel connection. In addition, it is necessary to provide a control circuit for charging and discharging the capacitors.

Although properties of capacitors are being focused, few proposals have been made on a structure capable of enduring the lifetime of a vehicle, etc. as a unit of an emergency power supply integrating a plurality of capacitors and a control circuit into each other.

Furthermore, conventionally, when circuit components such as a capacitor and various kinds of elements to be attached to a circuit board require heat radiation, for heat radiation, in general, a heat radiator is attached to a circuit board or circuit components and then circuit components are allowed to be pressure welded to this heat radiator. Thus, heat radiation is effected.

Figure 14:
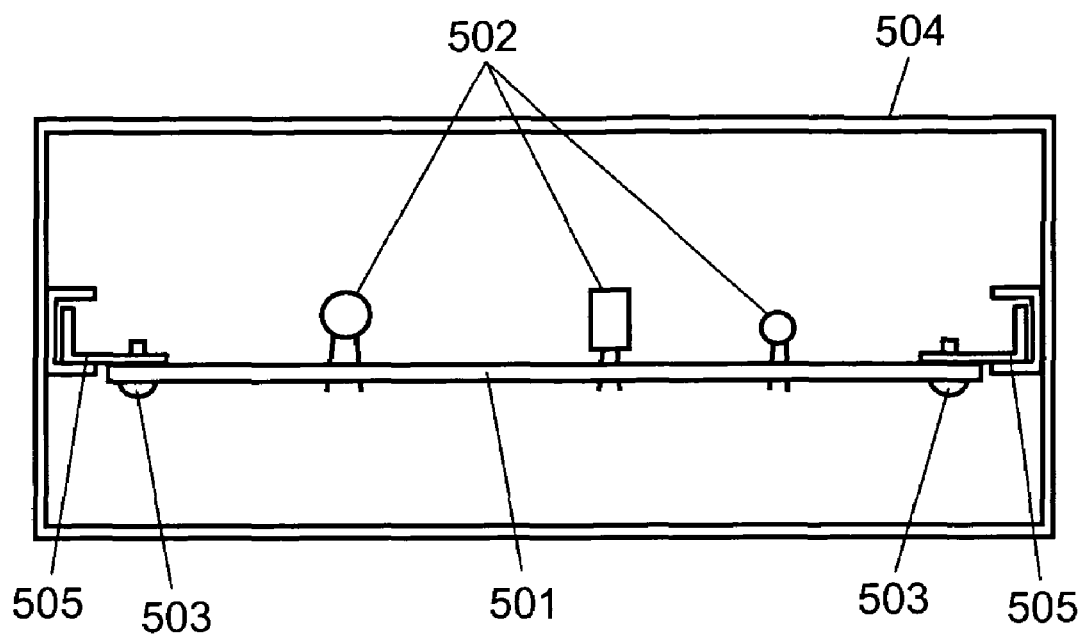
FIG. 14 is a sectional view showing conventional electronic equipment.

However, in a conventional attaching structure of a circuit board shown in FIG. 14, end portions of the circuit board are fixed to attaching portions of a case. Therefore, when the circuit board is provided with a large and heavy heat radiator, under using conditions in which large loads of vibration or shock are applied, stress due to vibration is concentrated on the attaching portions of the heat radiator or soldering portions of circuit components that are pressure welded thereto, so that the soldering portions may be damaged or the circuit board itself may be damaged.

The present invention is made to solve such problems mentioned above. The present invention contributes to the improvement of the reliability and safety of a used system by allowing a capacitor block composed of a plurality of capacitors and a control circuit portion for controlling the charging and discharging to be integrated as a unit.

Furthermore, the present invention provides electronic equipment in which a weight load is not applied to a circuit board and which has a high reliability even under harsh using conditions particularly in a vehicle, etc. in which vibration or shock is applied Hereinafter, an exemplary embodiment of the present invention is described with reference to drawings.

Figure 1:
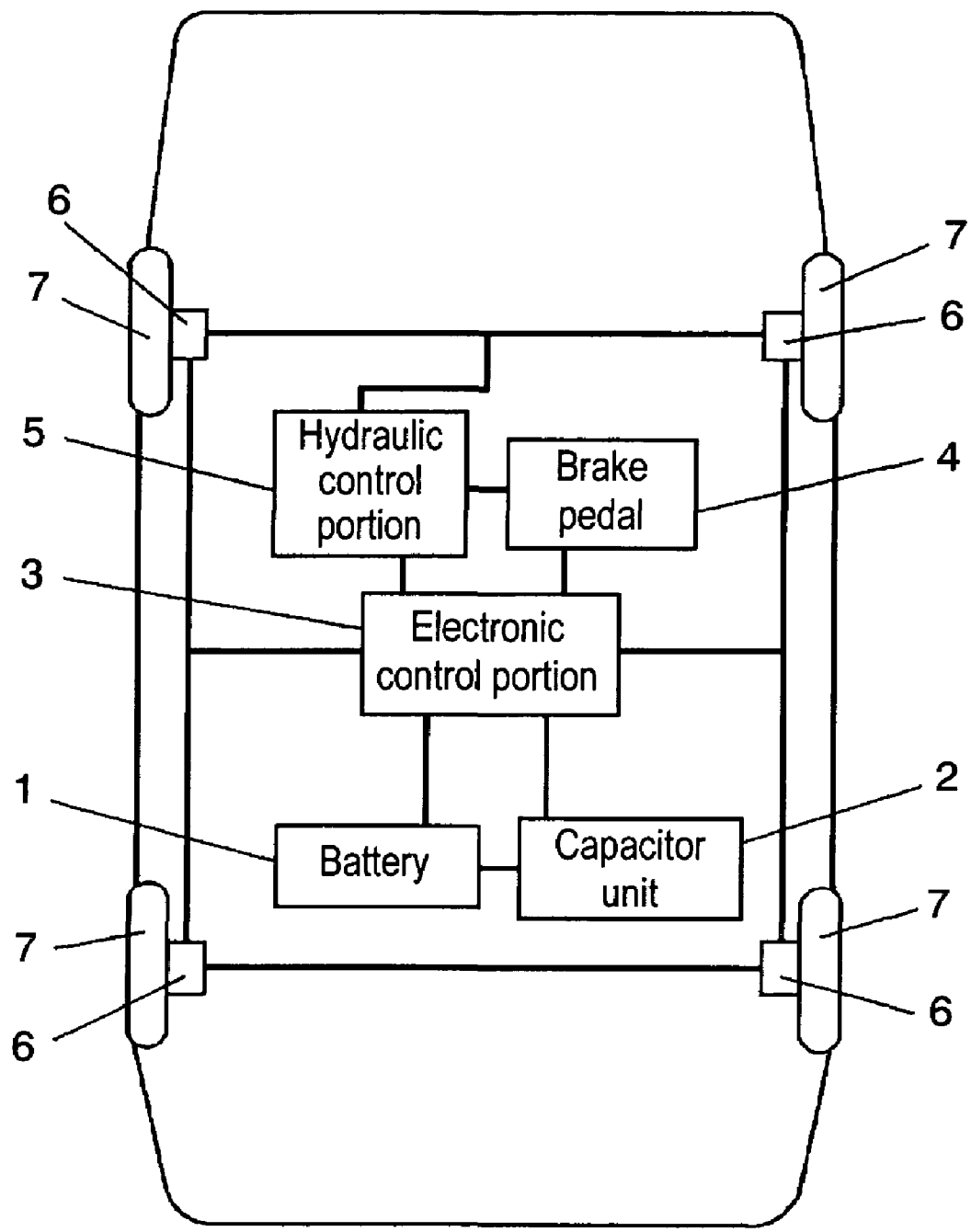
FIG. 1 shows a configuration of an electronic braking system of a vehicle in an exemplary embodiment of the present invention.

FIG. 1 is a view showing a configuration of an electronic control braking system of a vehicle in the exemplary embodiment of the present invention. In FIG. 1, battery 1 for supplying power and capacitor unit 2 as an emergency power supply are electrically connected to electronic control portion 3 for controlling an electronic control braking system, respectively. Furthermore, electronic control portion 3 is also connected to brake pedal 4 and hydraulic control portion 5, and this hydraulic control portion 5 is connected to brake 6 and tire 7.

In the electronic control braking system having such a configuration, when electric power supply from battery 1 is lost due to some contingencies during operation, a function of electronic control braking system is lost. When such contingencies occur during driving, brake does not work, making it impossible to brake a vehicle. In order to prevent it, capacitor unit 2 is connected, which is configured to release electric charges accumulated in capacitor unit 2 based on an instruction from electronic control portion 3 so as to operate the electronic control braking system and to brake a vehicle when contingencies occur.

This present invention relates to capacitor unit 2. The description therefor follows.

Figure 2:
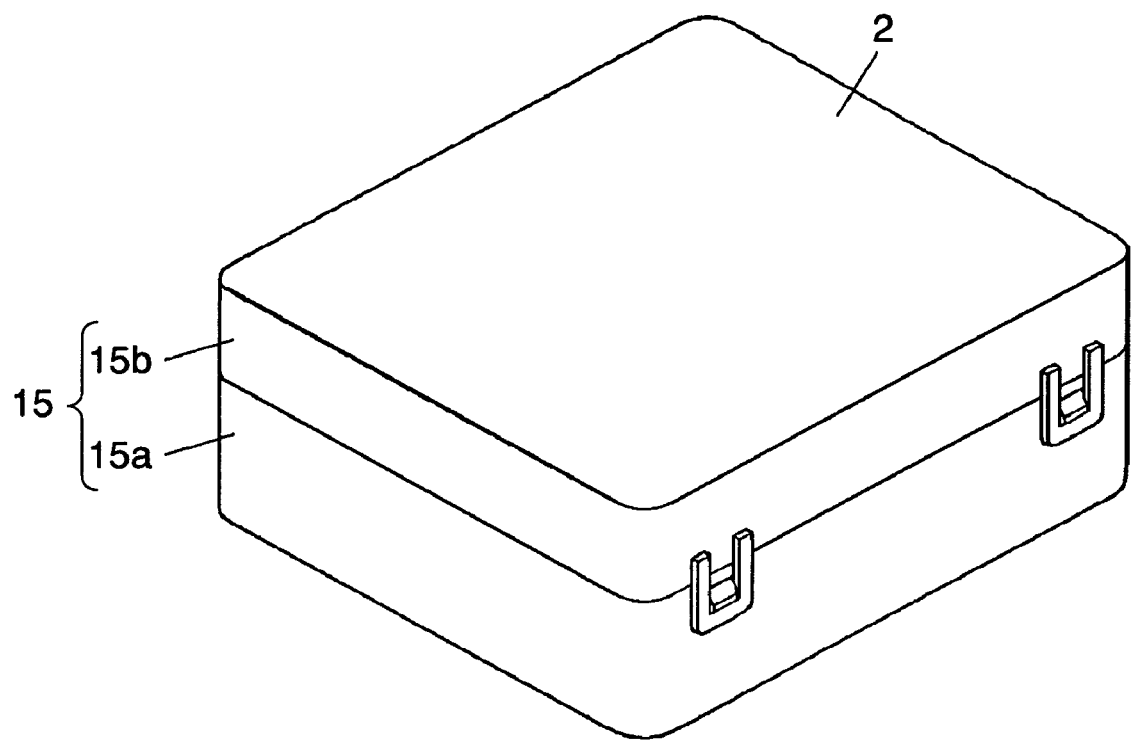
FIG. 2 is an exterior perspective view showing a capacitor unit in an exemplary embodiment of the present invention.
Figure 3:
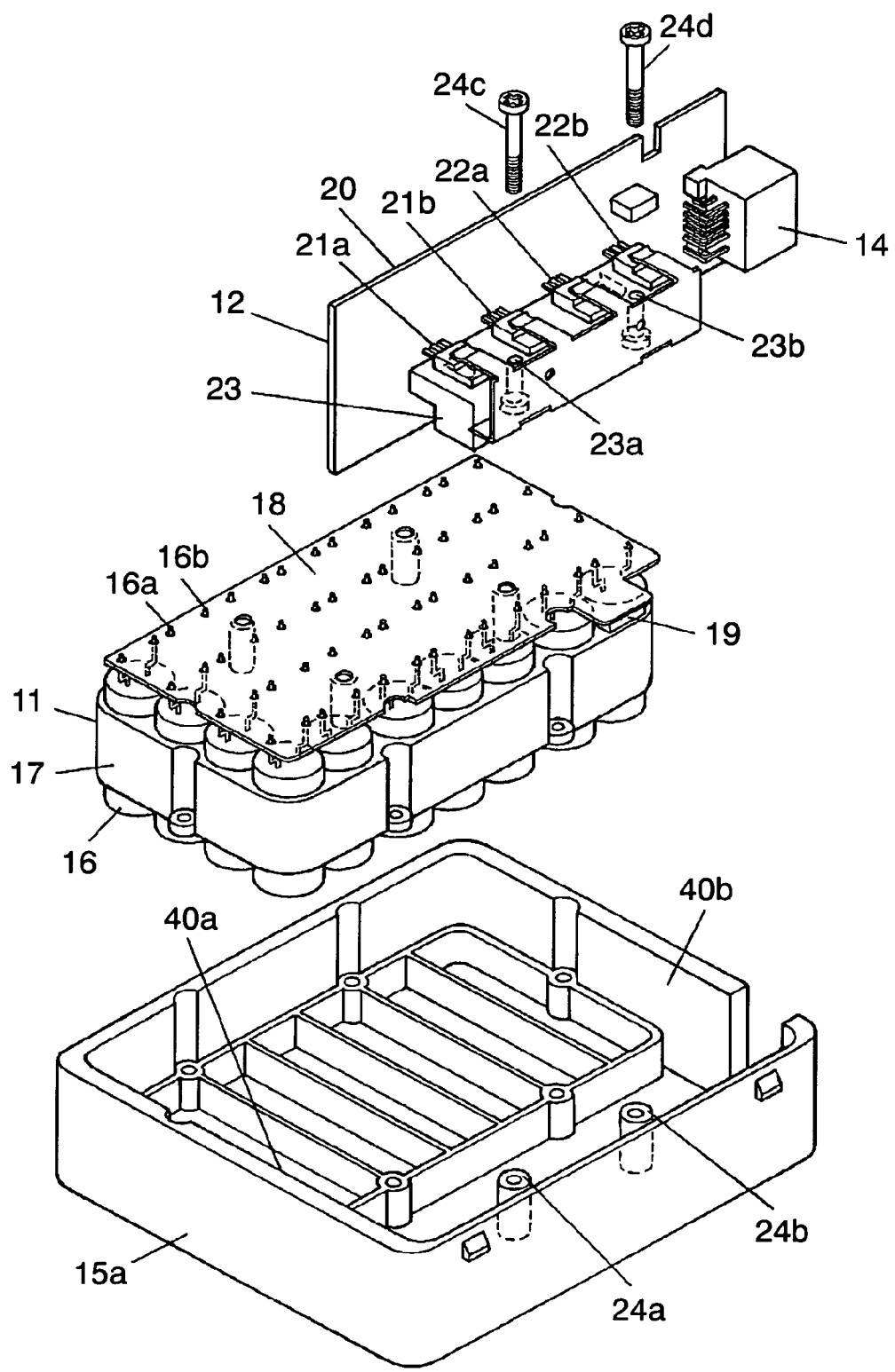
FIG. 3 is an exploded perspective view showing a main part of the capacitor unit.
Figure 4:
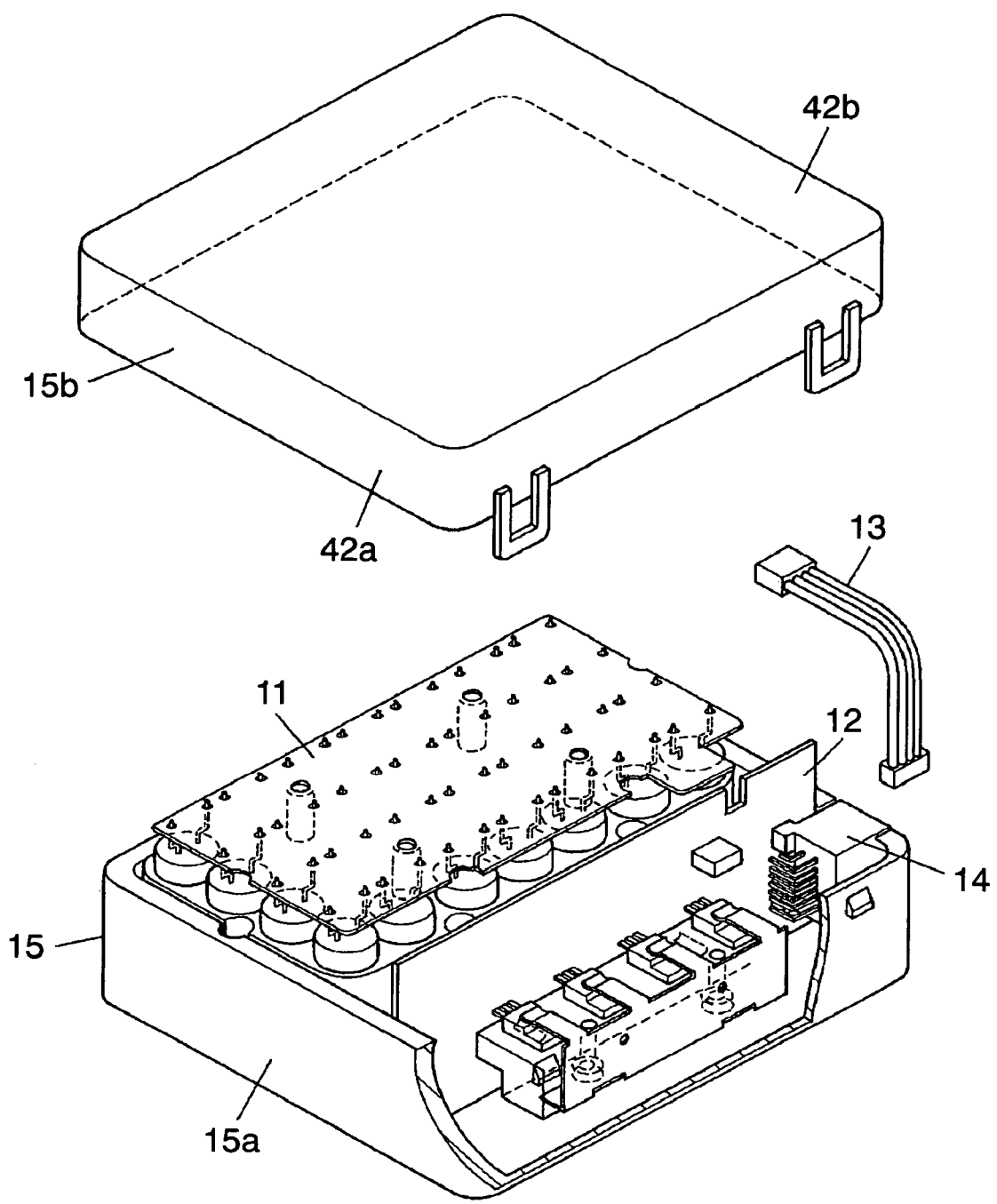
FIG. 4 is a perspective view showing a main part of the capacitor unit with an upper cover removed.
Figure 5:
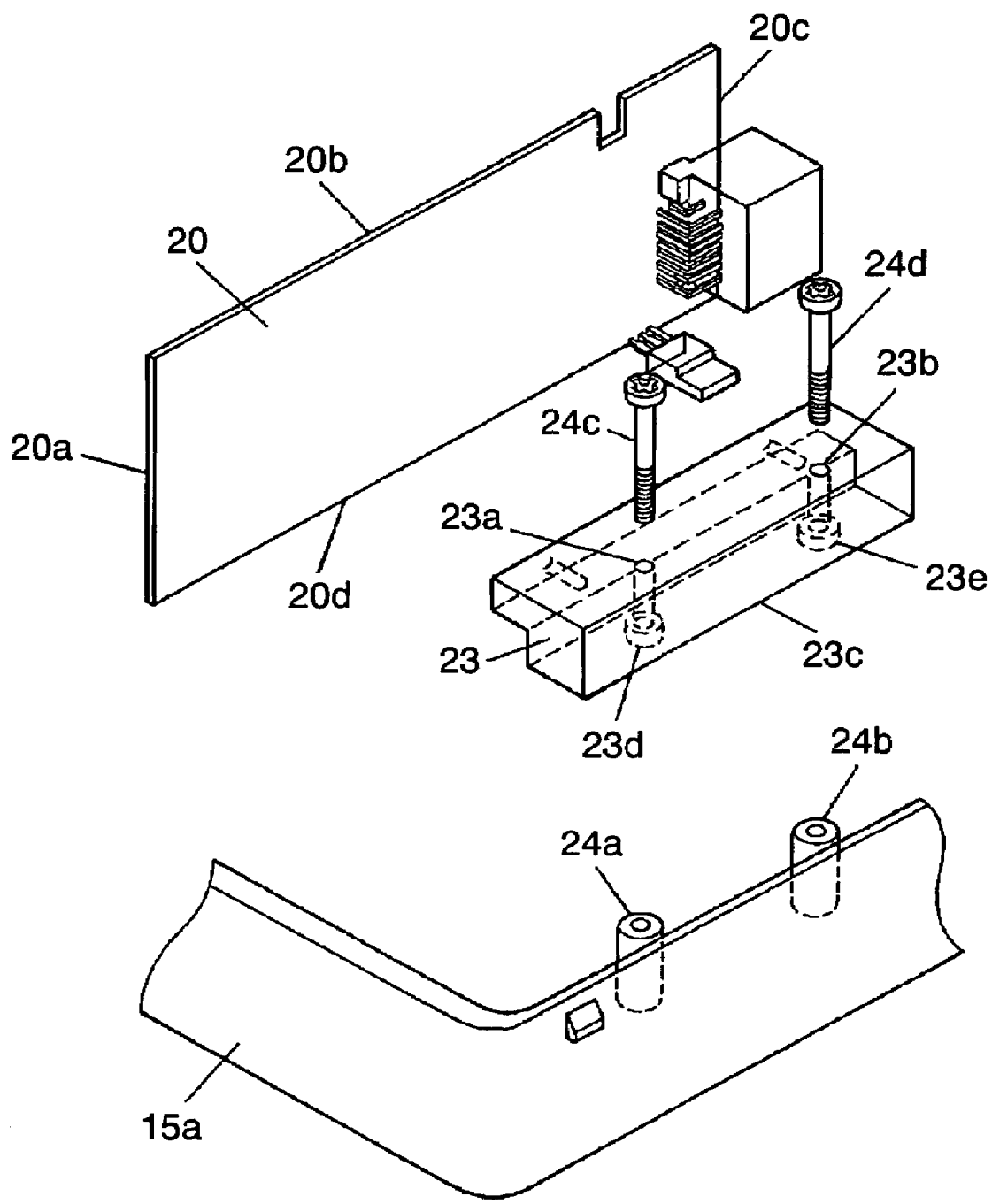
FIG. 5 is an exploded perspective view showing a main part of a control circuit portion of the capacitor unit.

FIG. 2 is an exterior perspective view showing a capacitor unit 2. FIGS. 3, 4 and 5 are exploded perspective views of capacitor unit 2, respectively.

In each drawing, relay connector 13 electrically connects capacitor block 11 and control circuit portion 12. Connector 14 is electrically connected to electronic control portion 3 of the electronic control braking system. These are housed in case 15 composed of lower case 15a and upper cover 15b.

Herein, firstly, the configuration of capacitor block 11 is described.

Capacitor 16 has, on its upper surface, lead wire 16a having a positive polarity and lead wire 16b having a negative polarity which extend in the same direction. In this exemplary embodiment, 28 capacitors are configured in a way in which seven series-connected capacitors are arranged in four parallel lines. When allowable voltage per capacitor 16 is 2V, in order to be applied to a 14V system, seven capacitors are connected in series, and in order to secure necessary electric charge, the seven series-connected capacitors are arranged in four parallel lines. Thus, an amount of electric charge is increased.

Holder 17 stably retains the above-mentioned 28 capacitors 16 in a way in which seven series-connected capacitors are arranged in four parallel lines. At this time, a plurality of capacitors 16 are assembled by using a jig, etc. so that the heights of upper surfaces 16c from which lead wires 16a and 16b extend are substantially uniform in 28 capacitors.

Circuit board 18 is provided with a circuit pattern for connecting a plurality of capacitors 16 in a way in which seven series-connected capacitors are arranged in four parallel lines. Then, lead wires 16a and 16b of capacitor 16 are inserted into and soldered to a soldering land portion of circuit board 18. Circuit board 18 is provided with connector 19 on the end portion thereof so as to be electrically connected to control circuit portion 12. The thus configured capacitor block 11 is housed in lower case 15a and fixed thereto with a screw, etc.

Then, control circuit portion 12 is described in detail.

Figure 6:
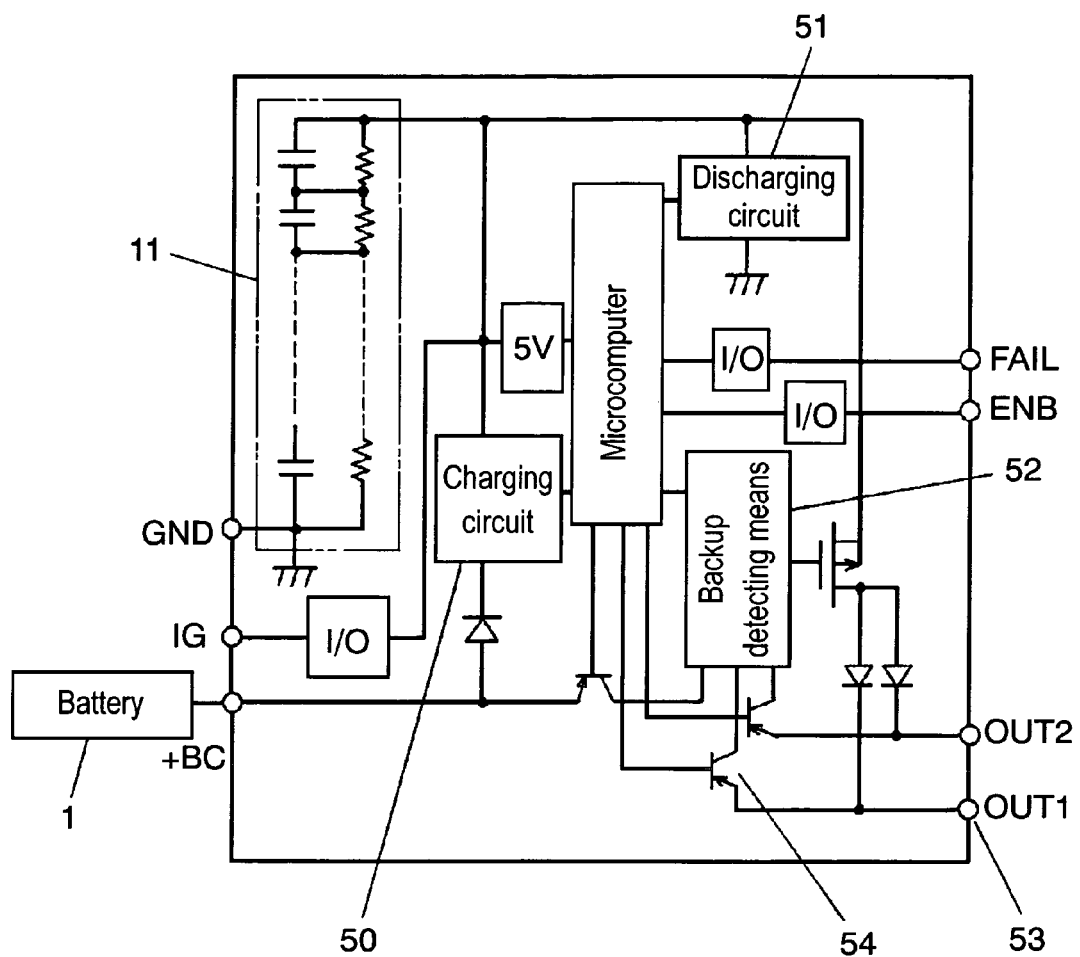
FIG. 6 is a block diagram showing a circuit of the capacitor unit.

FIG. 6 is a block diagram showing a circuit configuration of the capacitor unit of the present invention.

Capacitor unit 2 includes a microcomputer for transmitting and receiving various signals, capacitor block 11, charging circuit 50 for instructing capacitor block 11 to charge, discharging circuit 51 for instructing capacitor block 11 to discharge, back-up detecting means 52 for detecting voltage output from battery 1, and FET switch 54. Capacitor block 11 is formed of a plurality of capacitors by using, for example, an electric double layer capacitor capable of rapid charging and discharging as an auxiliary power supply for supplying electric power to hydraulic control portion 5 via electric control portion 3 when battery 1 is in an abnormal state. FET switch 54 enables discharging to electric control portion 3 from capacitor block 11 via OUT terminal 53 when back-up detecting means 52 detects abnormality in electric voltage.

Then, a structure of control circuit portion 12 is described with reference to FIGS. 3 to 5. In these drawings, components that are not related to the present invention are omitted. Although not shown in circuit board 20, a circuit pattern of charging and discharging circuit is provided. In the exemplary embodiment of the present invention, two FETs 21a and 21b as a circuit component for charging, diode 22a as a circuit component for charging and resistor 22b are shown. These circuit components are circuit components generating heat in which a large amount of electric current flows at the time of charging and discharging. FETs 21a and 21b, diode 22a and resistor 22b have lead wires fixed to circuit board 20 by soldering, on the rear surface of which a heat radiating portion is formed. The heat radiating portion is pressure welded to heat radiator 23 with an appropriate pressure.

The thus configured control circuit portion 12 is housed in lower case 15a in an upright position. Relay connector 13 is led out from circuit board 20 and fitted into and electrically connected to connector 19 of capacitor block 11. Control circuit portion 12, which is housed in an upright position, is disposed so that a surface on which heat radiator 23 and FETs 21a and 21b as circuit components for charging, diode 22a as a circuit component for charging and resistor 22b are mounted is positioned at the opposite side to capacitor block 11 with circuit board 20 sandwiched therebetween. Thus, a site generating heat by electric current flowing at the time of charging and discharging of capacitor block 11 can be disposed at a distance from capacitor block 11 with circuit board 20 as a spacer. In a capacitor unit using a plurality of capacitors 16, the performances of capacitors are required to be uniform. The ambient temperature of each capacitor is desired to be as uniform as possible. The exemplary embodiment makes it possible to suppress variation in temperature in the capacitor portion by heat generated at the time of charging and discharging as much as possible.

Heat radiator 23 is provided with two holes 23a and 23b to be fixed to lower case 15a. Furthermore, at the corresponding positions of lower case 15a, fixing bosses 24a and 24b are formed to be screwed with screws 24c and 24d.

On surface 23c of heat radiator 23 at the side that is incorporated into lower case 15a, concave holes 23d and 23e, which are concentric to holes 23a and 23b and fitted into fixing bosses 24a and 24b, are formed. Positioning is carried out by concave holes 23d and 23e and fixing bosses 24a and 24b in attachment.

In this fixing state, circuit board 20 is housed in lower case 15a in an upright position and outer peripheral surfaces 20a, 20b, 20c and 20d of circuit board 20 are kept in a free state in lower case 15a.

As mentioned above, in the exemplary embodiment of the present invention, since heat radiator 23 is fixed to lower case 15a but circuit board 20 is not fixed to lower case 15a, circuit board 20 can be kept in a free state. Therefore, even in a case where loads of thermal expansion and contraction vibration are applied, stress is not applied on soldering portions of the circuit components mounted on circuit board 20. Thus, reliability can be expected to be improved.

A method of stable heat radiation of FETs 21a and 21b as a circuit component for charging, diode 22a as a circuit component for discharging and resistor 22b to heat radiator 23 is described with reference to FIGS. 7 and 8.

Figure 7:
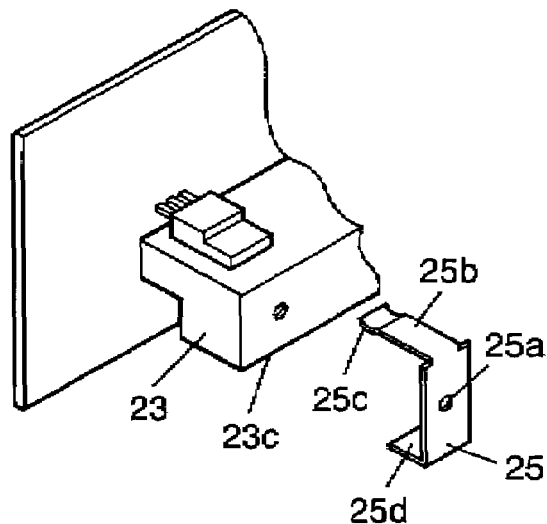
FIG. 7 is a perspective view showing a configuration of a leaf spring portion of the control circuit portion.

In FIG. 7, leaf spring 25 made of an elastic member such as stainless steel, etc. has an approximately rectangular U shape and at the center thereof, fixing hole 25a that is directed to heat radiator 23 is provided. Both end portions are bent. One end portion is elastic piece 25b extending in an arm shape and is provided with R processing portion 25c so as to pressure weld certain positions of body parts of FET 21a and 21b, diode 22a and resistor 22b. Another end portion is guide portion 25d that is brought into contact with surface 23c at the side of heat radiator 23, which is incorporated into lower case 15a, in an appropriate length.

Furthermore, although not shown in the drawings, on a surface on which FETs 21a and 21b, diode 22a and resistor 22b are pressure welded to heat radiator 23, grease made of silicon, etc. for promoting heat radiation is applied. Pressure welding force by leaf spring 25 is set to the bearing of 0.1 N to 4.5 N.

Figure 8:
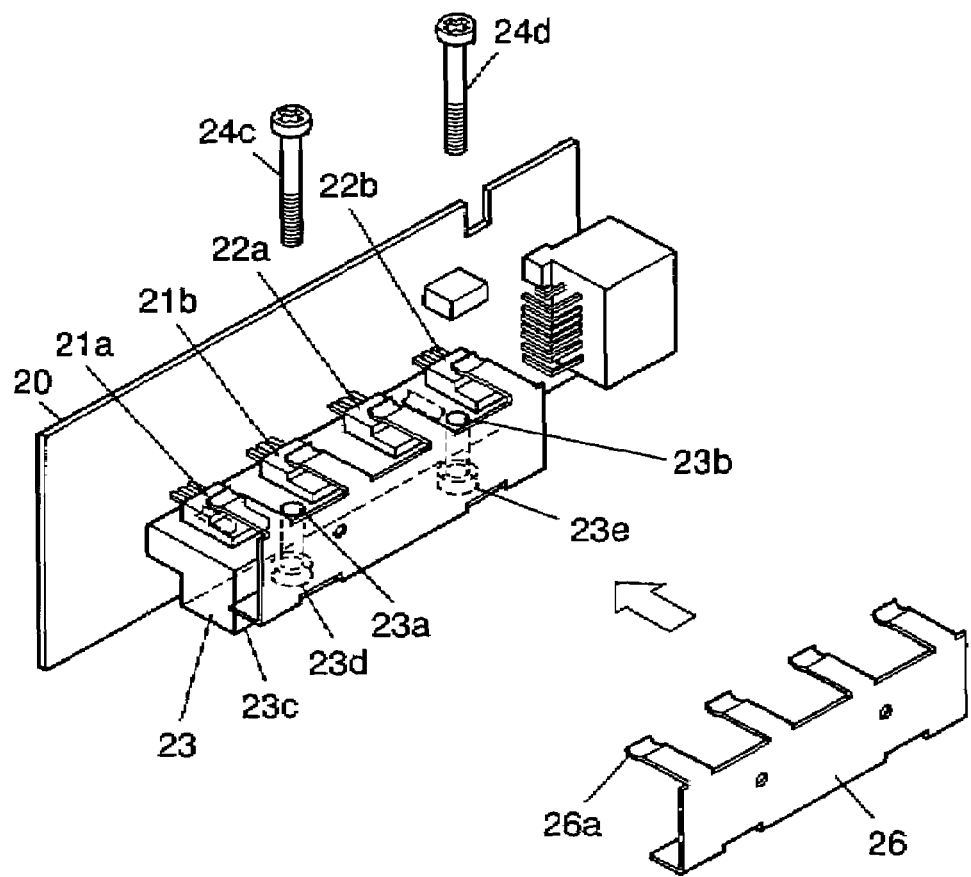
FIG. 8 is a perspective view showing a configuration of a leaf spring portion of the control circuit portion.

Leaf spring 26 shown in FIG. 8 is fabricated by coupling structures of leaf springs 25. When a plurality of circuit components requiring heat radiation exist (in the exemplary embodiment, four circuit components exist), leaf spring 26 in which elastic pieces 26a are coupled in accordance with the number of the circuit components is used, thereby enabling pressure welding simultaneously.

Thus, with a pressure welding structure using leaf spring 26, FETs 21a, 21b and diode 22a as a circuit component for charging and discharging and resistor 22b are fixed to circuit board 20 at the soldering portion. However, the fixing is carried out by just being pressure welded to heat radiator 23 with an appropriate pressure. Therefore, even when difference in thermal expansion and contraction in each member due to the change in temperature, etc. occurs, it is possible to relax stress generating in the soldering portion. Furthermore, by forming leaf spring 25 in substantially an approximately rectangular U shape so as to regulate the position with respect to heat radiator 23 by guide surface 25d, distribution in pressure welding force can be reduced. In addition, with the use of grease for promoting heat radiation, pressure welding force itself can be reduced. Furthermore, it is possible to pressure weld a plurality of circuit components at the same time by leaf spring 26, thus making it possible to reduce man-hour and to unify the pressure welding force.

The pressure welding force is set to 0.1 N to 4.5 N. This pressure welding force is determined based on a minimum load capable of reliably releasing heat to heat radiator 23, and an acceptable stress, etc. of soldering portions with respect to vibration on the soldering portions of lead wires of circuit components to be pressure welded and circuit board 20 and temperature change. Controlling the pressure welding force in this range enables more reliable heat radiation and prevention of damage in the soldering portion due to vibration and temperature change, etc., which can lead to improvement in the reliability.

Next, a shield structure of control circuit portion 12 is described with reference to perspective views of a main part shown in FIGS. 9, 10 and 11.

Various electronic control systems used in vehicles require not only basic functional assurance but also strict noise resistance. The measurement therefor is a major element of development.

Figure 9:
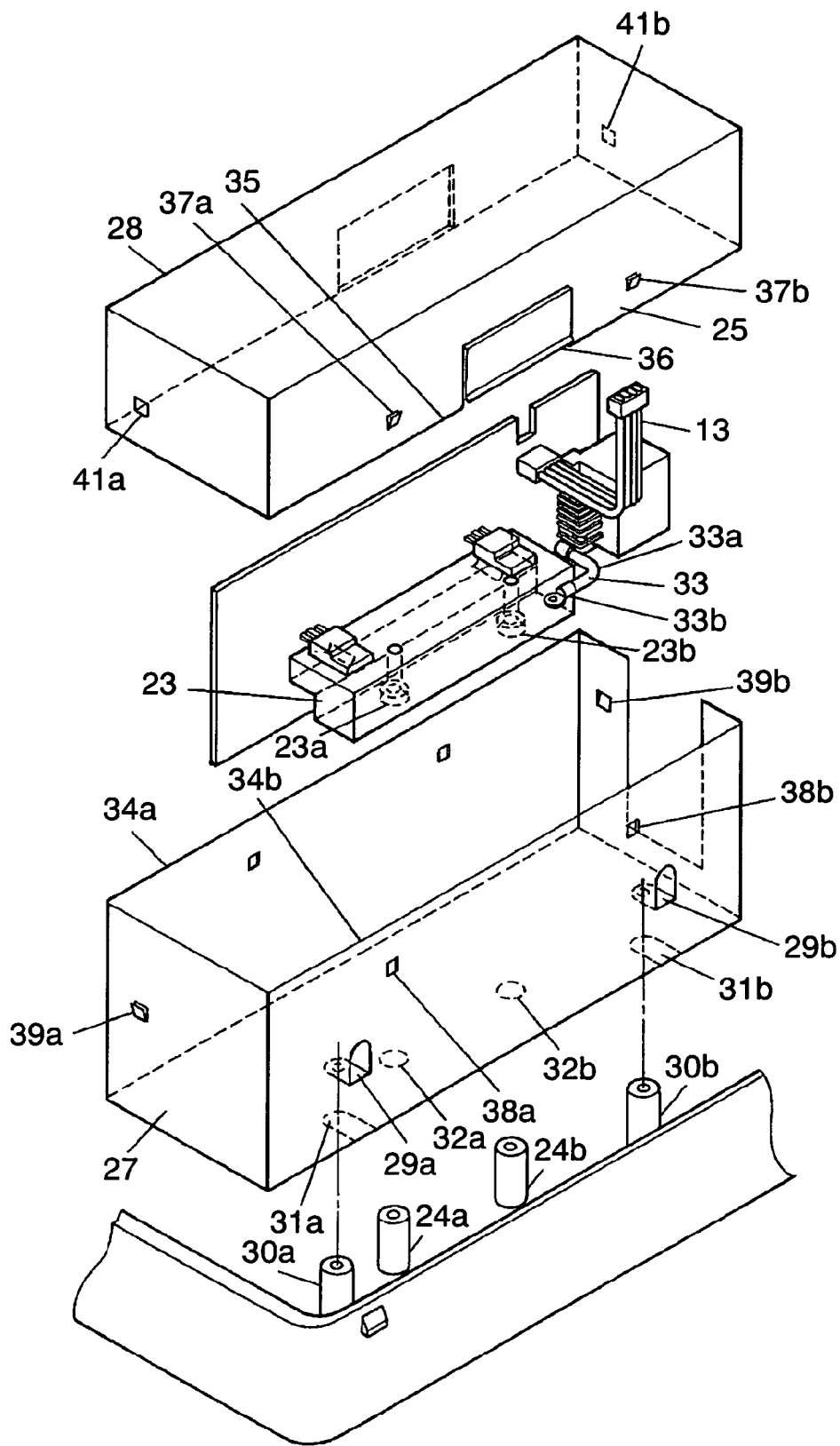
FIG. 9 is an exploded perspective view showing a shield structure of the control circuit portion of the capacitor unit.

In FIG. 9, a shield case is divided into an upper portion and a lower portion and includes lower shield case 27 made of metal and upper case 28.

Lower shield case 27 is provided with two case fixing pieces 29a and 29b by allowing the side surface to rise on the internal surface side.

Lower case 15a is provided with fixing bosses 30a and 30b extending in the positions corresponding to case fixing pieces 29a and 29b. On the bottom surface of lower shield case 27, holes 31a and 31b are formed in the positions concentric with respect to case fixing pieces 29a and 29b. Furthermore, on the positions corresponding to bosses 24a and 24b for fixing heat radiator 23 of control circuit portion 12, holes 32a and 32b, through which fixing bosses 24a and 24b passes, are formed.

One ground terminal 33 extends from circuit board 20 of control circuit portion 12. Ground terminal 33 includes lead wire 33a and terminal 33b at the tip thereof. Opposite end of lead wire 33a is soldered to a ground of circuit board 20.

In the configuration mentioned above, firstly, when lower shield case 27 is incorporated into lower case 15a so that holes 31a and 31b of lower shield case 27 are inserted into fixing bosses 30a and 30b, case fixing pieces 29a and 29b are brought into contact with fixing bosses 30a and 30b. Then, control circuit portion 12 is incorporated so that holes 23a and 23b of heat radiator 23 are fitted into fixing bosses 24a and 24b of lower case 15a, terminal 33b of ground terminal 33 and case fixing piece 29b are together fastened to fixing bosses 30b with a screw. Another case fixing piece 29a is fixed to fixing boss 30a with a screw. In this state, upper shield case 28 is covered, whereby a shield structure is formed. Also in the circuit structure of control circuit portion 12, various noise components ought to be provided. However, by further covering an entire portion of control circuit portion 12 with lower shield case 27 and upper shield case 28, high noise resistant property can be exhibited.

Next, a method for fabricating lower shield case 27 and upper shield case 28 is described.

On two side surfaces of upper shield case 28, two guide surfaces 35 located at the inside of wall surfaces 34a and 34b of lower shield case 27 and guide surface 36 located at the outside of wall surfaces 34a and 34b of lower shield case 27 are provided.

When incorporation is carried out in this state, wall surfaces 34a and 34b are sandwiched between guide surface 35 and guide surface 36, thus enabling lower shield case 27 and upper shield case 28 to be reliably fitted into each other.

Furthermore, an interval between guide surfaces 35 and 36 is set to become smaller than the thickness of wall surfaces 34a and 34b of lower shield case 27 in the direction in which guide surfaces 35 or/and 36 become close to each other. Thus, wall surfaces 34a and 34b are sandwiched between guide surfaces 35 and 36 with pressed thereby. As a result, lower shield case 27 and upper shield case 28 can be fabricated without looseness. At the same time, lower shield case 27 and upper shield case 28 can be reliably kept in a short state, enabling higher shield performance to be exerted.

Furthermore, on guide surface 35 of upper shield case 28, protrusions 37a and 37b are formed. On lower shield case 27, holes 38a and 38b are formed on the positions corresponding to the protrusions 37a and 37b. Thus, it is possible to prevent the shield cases from floating or displacing after insertion by semi-fitting or fitting.

Similarly, on two surfaces in the longitudinal direction of lower shield case 27, rise pieces 39a and 39b are formed. The distance between the tip portions of rise pieces 39a and 39b is slightly larger than the distance between internal surfaces 40a and 40b of lower case 15a to be inserted.

When lower case 15a is inserted into lower shield case 27 in this state, rise pieces 39a and 39b and internal surfaces 40a and 40b are pressed into each other, and thus it is possible to prevent looseness and vibration of the lower shield case. Similarly, also on two surfaces in the longitudinal direction of upper shield case 28, rise pieces 41a and 41b are provided, and pressed into internal surfaces 42a and 42b of upper cover 15b. Thus, it is also possible to prevent looseness and vibration of upper shield case 28.

Figure 10:
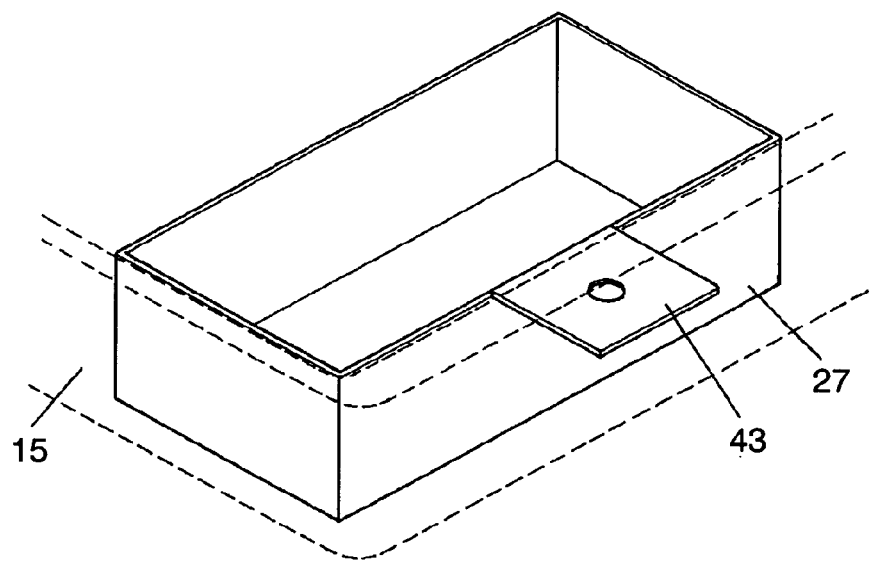
FIG. 10 is a perspective view showing a main part of a shield structure of the control circuit portion of the capacitor unit.

Next, in FIG. 10, on lower shield case 27 or upper shield case 28 (in this exemplary embodiment, the case of lower shield case 27 is described), piece 43 that is folded outwardly from the side surface is formed. It is led to the outside of case 15 in a state in which shield case 27 is incorporated into case 15. At the time of being incorporated into a vehicle, etc. by using piece 43, by fixing it to a ground of an external load or a chassis of ground potential with being electrically conducted thereto. Thus, a control circuit system can be shielded reliably.

Figure 11:
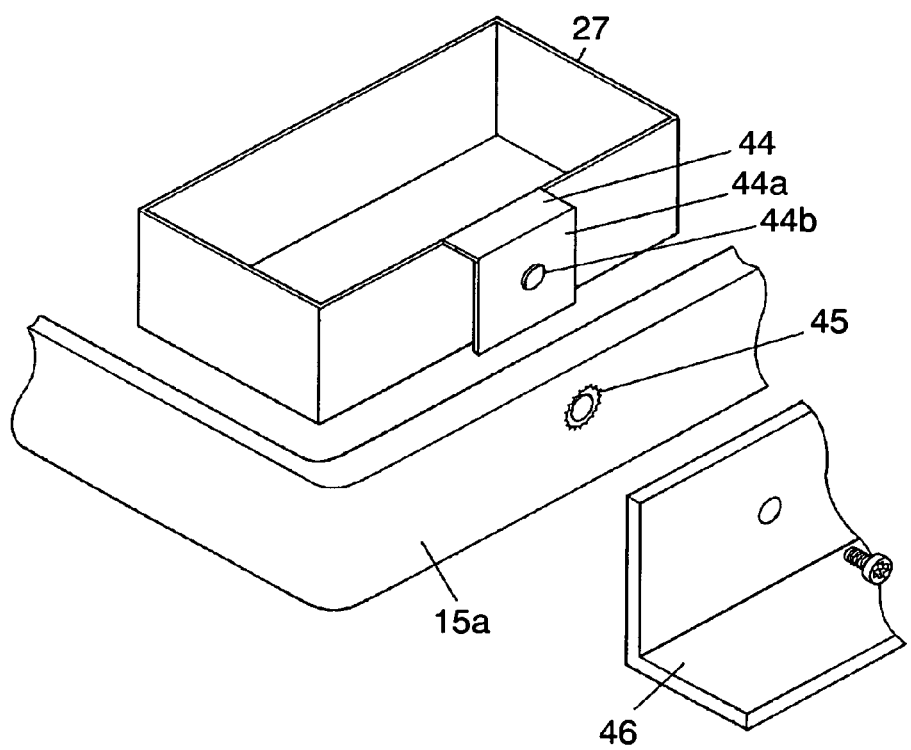
FIG. 11 is a perspective view showing a main part of a shield structure of the control circuit portion of the capacitor unit.

Furthermore, as shown in FIG. 11, piece 44, which is folded toward the side surface of lower shield case 27, is further folded in the middle thereof so as to form folding portion 44a. In the center portion of folding portion 44a, screwing hole 44b is formed. On the side surface of lower case 15a, a plurality of nuts 45 with an appropriate nominal diameter are formed by press-fitting or insert molding. Herein, screwing hole 44b of folded piece 44 is disposed in a dimensional relation in which screwing hole 44b corresponds to screw hole of nut 45 in a final product after the shield case is incorporated into the case 15. In this state, bracket 46 used for being attached to a vehicle is fastened together with nut 45. This makes it possible to secure ground potential of the shield case at the same time of working of attaching a bracket to a vehicle, thus enabling a control circuit system to be shielded reliably.

Figure 12:
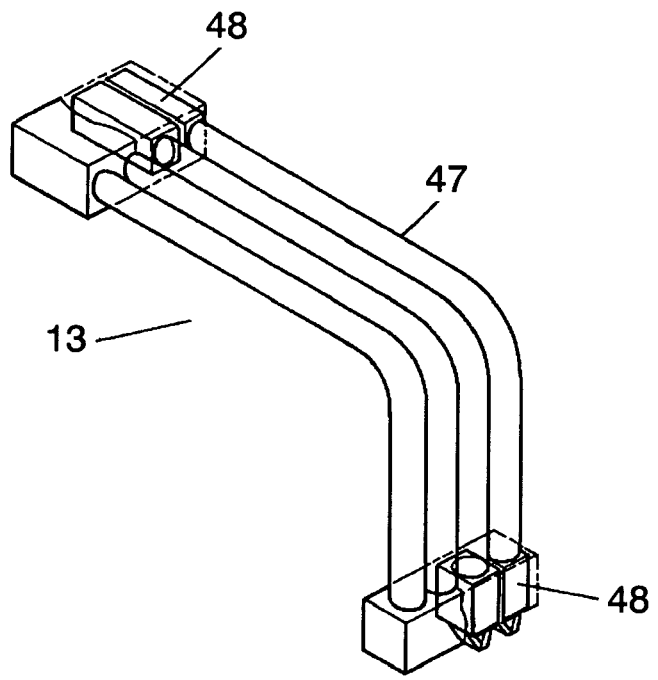
FIG. 12 is a perspective view showing a relay connector of the capacitor unit.

FIG. 12 shows relay connector 13 for electrically connecting circuit portion 12 and capacitor block 11. In relay connector 13, for example, when 5 A of current capacity is required, electric wires (+ and −) and connector terminals are required to have 5 A or more of current capacity. In such a case, however, electric wire having a large wire diameter or connector terminal having a large size are required, which may lead to an increase of occupied space in a product. In the configuration of this exemplary embodiment, two electric wires 47 whose current capacity is 2.5 A or more and about 3 A or less and two connector terminals 48 are arranged in parallel and used. With this configuration, although the number of connector portions is increased, small sized connector can be used. Furthermore, a plurality of electric wires 47 with small capacity or connector terminals 48 can be arranged in parallel.

Thus, the dimension of relay connector 13 in the up-and-down direction and back and forth direction can be reduced although the dimension in the parallel direction is increased. As is apparent from the perspective view shown in FIG. 4, since there is room in space in the parallel direction, an entire size can be downsized.

Figure 13:
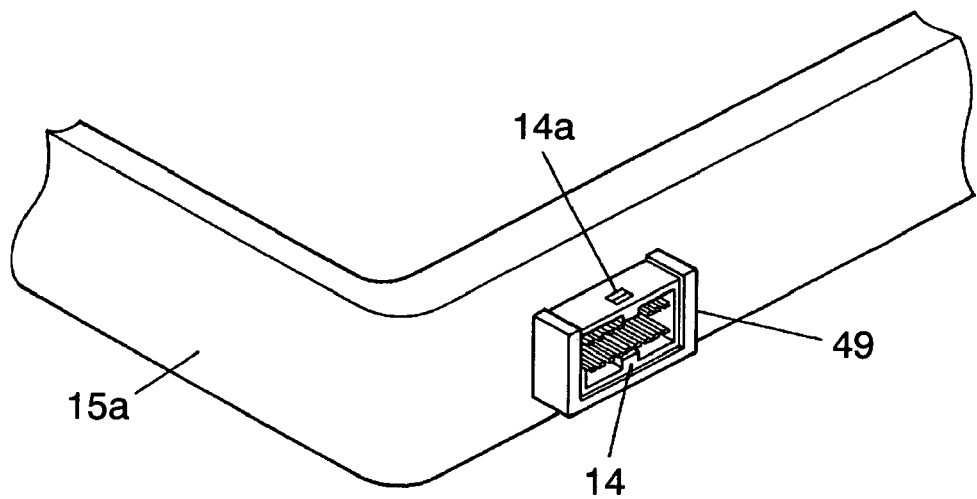
FIG. 13 is a perspective view showing a main part of a connector portion of the capacitor unit.

FIG. 13 is a perspective view showing a main part of a periphery of connector 14. The protection of the connector is described. Since connector 14 is fitted into a connector of an external load (not shown), it is protruded outwardly in a state of a final product from the viewpoint of workability. On lower case 15a, protection wall 49 for protecting connector 14 is provided so as to cover the outer periphery of connector 14. Furthermore, protection wall 49 does not cover only a site of fitting rock portion 14a provided in connector 14. This is because this configuration makes it easy to carry out fitting work and makes it possible to visually check a fitting state. This makes it possible to prevent the connector from being damaged due to handling of a final product, and certain contingencies occurring at the time of, for example, manufacturing process, delivery, attachment to a vehicle, and the like.

In order to solve the above-mentioned problems, the capacitor unit of the present invention has a control circuit for charging and discharging a capacitor arbitrarily and a means for detecting a state of a capacitor block, whereby the performance of the capacitor can be optimized. At the same time, a state of deterioration can be also monitored. In addition, the control circuit is incorporated into a case in an upright position, whereby it is possible to provide a suitable capacitor unit with improved space efficiency.

Furthermore, according to the capacitor unit of the present invention, a site generating heat by an electric current flowing at the time of charging and discharging the capacitor block can be located apart from the capacitor block with a circuit board disposed as a separator.

Furthermore, according to the capacitor unit of the present invention, since a heat radiator is used to be fixed to the case, it is possible to keep the circuit board constituting a control circuit portion to be in a free state without being fixing it to the case. As compared with a configuration in which the circuit board is directly fixed to the case with a screw, even when thermal expansion and contraction occurs due to temperature change, stress is not applied to soldering portions, etc. of circuit components constituting the circuit board. Therefore, it is possible to improve the reliability of the control circuit portion.

Furthermore, according to the capacitor unit of the present invention, when the heat radiator is fixed to the case, the position can be regulated.

Furthermore, according to the capacitor unit of the present invention, since the control circuit portion is fixed by using fixing holes of the heat radiator and fixing bosses of the case, the periphery of the circuit board of the control circuit portion can be kept to be in a free state in the case. Even under using conditions in which loads of vibration and shock, etc. are applied, a stress is not applied to the soldering portions of the circuit components to thus improve the reliability.

Furthermore, according to the capacitor unit of the present invention, circuit components requiring heat radiation of the control circuit portion are pressure welded to the heat radiator that is attached to the circuit board with a pressure suitable for heat radiation, whereby the increase in temperature of the circuit components is suppressed at the time of controlling charging and discharging, and the circuit components are prevented from being out of order. Thus, the capacitor unit of the present invention can be used for a long time.

Furthermore, according to the capacitor unit of the present invention, pressure is maintained appropriately by the pressure welding by a leaf spring, thereby relaxing a stress to the soldering portion of the circuit components due to thermal expansion and contraction and vibration. At the same time, secure heat radiation can be carried out.

Furthermore, according to the capacitor unit of the present invention, the pressure welding force of the circuit component can be stabilized and stable heat radiation effect can be achieved.

Furthermore, according to the capacitor unit of the present invention, the circuit components for charging and discharging to be pressure welded to the heat radiator can be mounted stably, which can lead to the improvement of the reliability of charging and discharging circuit.

Furthermore, according to the capacitor unit of the present invention, heat radiation of the circuit components can be promoted at the time of controlling charging and discharging of the capacitor unit, temperature increase can be suppressed with relatively low pressure welding force, and the disorder of circuit components can be prevented. Thus, the capacitor unit of the present invention can be used for a long time.

Furthermore, the capacitor unit of the present invention is determined based on a minimum load capable of reliably releasing heat to the heat radiator and an acceptable stress of the soldering portion with respect to the vibration on the soldering portions of the lead wires of the circuit components and the circuit board and temperature change, etc. Managing in this range enables more reliable heat radiation and prevention of cracks in the soldering portion due to vibration and temperature change, etc.

Furthermore, according to the capacitor unit of the present invention, when a plurality of circuit components are pressure welded to the heat radiator, attachment can be simplified and pressure welding force can be made uniform.

Furthermore, according to the capacitor unit of the present invention, a shield case is fixed to the case together with a ground of the circuit board, whereby the shield case can be fixed to the case reliably and at the same time the shielding effect can be improved by dropping the ground onto the circuit board. Thus, the reliability of the control circuit portion can be improved.

Furthermore, the capacitor unit of the present invention can be fabricated easily without using a fixing screw, etc. and has an excellent shielding property.

Furthermore, the capacitor unit of the present invention has a configuration in which looseness in fitting when the capacitor unit is fitted into the lower shield case is prevented. Furthermore, the fabricating property and the shielding property can be improved.

Furthermore, according to the capacitor unit of the present invention, a guide surface provided on the upper shield case and a wall surface of the lower shield case have one or more pairs of fitting portions of a hole and a boss on the positions corresponding to each other, so that the positioning can be carried out in a state in which when the upper shield case is incorporated into the lower shield case. Thus, fabricating property can be improved.

Furthermore, according to the capacitor unit of the present invention, lower shield case or/and upper shield case have, on the side surface thereof, a rise portion whose dimension is slightly larger than the dimension of the internal surface of the housing portion of the case, thus enabling the shield case to be housed in the case without looseness. Therefore, it is possible to prevent the occurrence of abnormal noise during driving, etc. by excluding looseness between the shield case and the housing.

Furthermore, according to the capacitor unit of the present invention, on the lower shield case or upper shield case, a piece folded outwardly from the side surface thereof is provided. The piece is led to the side surface of the case and connected to a ground of an external load through a ground connection. By allowing the shield case and the ground of the external load to be in the same potential, the shield performance can be stabilized.

Furthermore, according to the capacitor unit of the present invention, the shield case can be dropped onto the ground of a vehicle body via an attachment bracket to a vehicle. Thus, the shield performance can be stabilized.

Furthermore, according to the capacitor unit of the present invention, a relay connector for electrically connecting the capacitor block and the control circuit portion uses a plurality of connectors having current capacity smaller than that necessary for charging and discharging. Therefore, by using a small-sized connector and an electric wire having a small wire diameter, consequently, space efficiency and workability can be improved.

Furthermore, according to the capacitor unit of the present invention, it is possible to prevent the connector from being damaged due to drop or shock to the connector portion when the capacitor unit is fabricated, delivered, attached to a vehicle. Thus, the quality of the control circuit portion can be stabilized.

Furthermore, according to the capacitor unit of the present invention, the leaf spring is processed in a rectangular U shape. One end of the leaf spring has a surface that is brought into contact with a rear surface of the heat radiator and another end is formed so that the circuit components are pressure welded to the heat radiator. The center portion is fixed to the heat radiator with a screw. This configuration makes it possible to stabilize the pressure welding force of the circuit components and to realize a stable heat radiating effect.

As mentioned above, the present invention provides a capacitor unit capable of retaining a plurality of capacitors connected in series or in parallel with high reliability and capable of optimizing the properties of the capacitors by providing a charging and discharging circuit. In addition, the present invention can provide a capacitor unit having various considerations with respect to a structure for integrally incorporating the control circuit portion and a shield structure and having a high reliability and excellent usability.

Furthermore, the present invention can provide a capacitor unit with a considerably improved reliability, which can carry out heat radiation reliably and in which a stress is not applied to the soldering portions of the circuit components even under using conditions where loads of vibration or shock are applied.

INDUSTRIAL APPLICABILITY

A capacitor unit of the present invention can retain a plurality of capacitors connected in series or in parallel with high reliability and can optimize the properties of the capacitors by providing a charging and discharging circuit. Therefore, the capacitor unit of the present invention is suitable for a use as a capacitor unit for an auxiliary power supply in an electric control braking system of a vehicle, etc. Furthermore, according to the capacitor unit of the present invention, the heat radiator is fixed to the case by screwing and the circuit board is allowed to be in a free state in the case. Thus, the capacitor unit of the present invention can provide a retaining structure capable of considerably improving the reliability in which a stress is not applied to a soldering portion of the circuit component. Thus, the capacitor unit of the present invention is suitable for a use in the application requiring resistance to vibration and thermal shock.

The invention claimed is:

1. A capacitor unit comprising:
   a capacitor block formed by incorporating a plurality of capacitors into a holder with body portions of the capacitors sandwiched and electrically connecting the capacitors in series or in parallel;
   a control circuit portion including a charging and discharging circuit for charging or discharging the capacitor block;
   a relay connector for electrically connecting the capacitor block and the control circuit portion; and
   a case housing the capacitor block, the control circuit portion and the relay connector,
   wherein the control circuit portion comprising:
      a circuit board;
      a circuit component forming the charging and discharging circuit;
      a heat radiator for suppressing heat generation of the circuit component in charging and discharging;
      a microcomputer for detecting and controlling states of the charging and discharging circuit and the capacitor block; and
      a connector connected to an external load; and
   wherein the control circuit portion is incorporated into the case in a way in which the circuit board is housed in the case in an upright position with respect to the case and the circuit board is out of direct physical contact with the case;
   wherein the heat radiator has a fixing hole, the case has a fixing boss corresponding to the hole formed on the heat radiator, and the hole and the boss are screwed to be fixed in the case;
   wherein the circuit component is pressure welded to the heat radiator by using an elasticity of a leaf spring attached to the heat radiator; and
   wherein the leaf spring is processed in a rectangular U shape, in which one end has a surface that is brought into contact with a rear surface of the heat radiator and another end has a pressure welding portion that allows the circuit component to be pressure welded to the heat radiator, and a center portion thereof is fixed to the heat radiator with a screw.

2. The capacitor unit according to claim 1, wherein the control circuit portion is housed in the case in a way in which a surface on which the circuit component forming the charging and discharging circuit and the heat radiator are mounted is located opposite side to the capacitor block.

3. The capacitor unit according to claim 1, wherein a concave hole capable of being fitted into a periphery of the fixing boss formed in the case is provided on a side of a case surface of the hole of the heat radiator.

4. The capacitor unit according to claim 3, wherein a periphery of the circuit board, which is fixed by the hole of the heat radiator and the fixing boss, is maintained in a free state in the case.

5. The capacitor unit according to claim 1, wherein the circuit component requiring heat radiation is pressure welded to the heat radiator with a pressure suitable for heat radiation.

6. The capacitor unit according to claim 5, wherein the leaf spring has a guide portion for guiding a vertical direction of the circuit component so that the circuit component is not fallen in a right and left direction.

7. The capacitor unit according to claim 5, wherein the circuit component requiring heat radiation is pressure welded to the heat radiator via grease for promoting heat radiation.

8. The capacitor unit according to claim 5, wherein the leaf spring is connected so that a plurality of the circuit components can be pressure welded simultaneously.

9. The capacitor unit according to claim 1, wherein:
   the control circuit portion is incorporated into the case covered with a shield case which are divided into an upper shield case and a lower shield case;
   the lower shield case has one or more fixing pieces to be fixed to the case, the fixing piece being obtained by allowing a part of the lower shield case to rise;
   the case has a screw-fixing boss at the position corresponding to the fixing piece;
   a ground terminal extends from a ground of the circuit board; and
   the ground terminal and the lower shield case are together fastened to the fixing boss with a screw.

10. The capacitor unit according to claim 9, wherein the upper shield case has a guide surface positioned on an inside of a wall surface of the lower shield case and a guide surface positioned on an outside of a wall surface of the lower shield case; and
   the upper shield case and the lower shield case are fitted into each other at the guide surface.

11. The capacitor unit according to claim 9, wherein
   the upper shield case has a first guide surface and a second guide surface;
   the first guide surface and the second guide surface or both are processed to be deformed in the direction in which the first guide surface and the second guide surface become close to each other, thereby preventing looseness in fitting when they are fitted into the lower shield case.

12. The capacitor unit according to claim 11, wherein at least one of the first guide surface and the second guide surface and a wall surface of the lower shield case have one or more pairs of fitting portions of a hole and a boss on each corresponding position, thereby regulating the positions thereof when they are incorporated into each other.

13. The capacitor unit according to claim 9, wherein the lower shield case or/and the upper shield case have, on the side surface thereof, a rise whose dimension is slightly larger than a dimension of an internal surface of a housing portion of the case, and the shield case is housed in the case without looseness.

14. The capacitor unit according to claim 9, wherein the lower shield case or the upper shield case has a piece that is folded outwardly from the side surface, and the piece is led to the side surface of the case and connected to a ground of an external load through a ground connection.

15. The capacitor unit according to claim 14, wherein an outer peripheral surface of the case is provided with a screw fixing nut for fixing a bracket to be attached to a fixed body; and the piece that is folded outwardly from the side surface of the lower shield case is fixed to the bracket together with the screw fixing nut of the case.

16. The capacitor unit according to claim 1, wherein a connector for electrically connecting the capacitor block and the control circuit portion is configured by using a plurality of connectors having current capacity that is smaller than the current capacity necessary for charging and discharging.

17. The capacitor unit according to claim 1, wherein a connector that is electrically connected to an outside of the control circuit portion is protruded from a part of the case and the periphery thereof is provided with a protection wall formed on the case.

18. The capacitor unit according to claim 1, wherein a leaf spring is mounted to both the heat radiator and the circuit component, the leaf spring including an elastic portion disposed on the circuit component.

19. The capacitor unit according to claim 18, wherein the circuit component contacts the elastic portion and the heat radiator.

* * * * *